United States Patent

Diniz et al.

[11] Patent Number: 6,043,718
[45] Date of Patent: Mar. 28, 2000

[54] TEMPERATURE, SUPPLY AND PROCESS-INSENSITIVE SIGNAL-CONTROLLED OSCILLATORS

[75] Inventors: George F. Diniz, Liberty; Ronald B. Gray, III, Greensboro, both of N.C.

[73] Assignee: Analog Devices, Inc., Norwood, Mass.

[21] Appl. No.: 09/144,304

[22] Filed: Aug. 31, 1998

[51] Int. Cl.[7] .............................. H03B 5/04; H03B 5/24
[52] U.S. Cl. .......................... 331/57; 331/175; 331/185; 331/186; 327/261; 327/262; 327/264; 327/266
[58] Field of Search .............................. 331/57, 175, 185, 331/186; 327/261, 262, 264, 266

[56] References Cited

U.S. PATENT DOCUMENTS

| | | | |
|---|---|---|---|
| 5,191,301 | 3/1993 | Mullgrav, Jr. ............................. | 331/57 |
| 5,352,945 | 10/1994 | Casper et al. . | |
| 5,426,398 | 6/1995 | Kuo ........................................... | 331/57 |
| 5,469,120 | 11/1995 | Nguyen et al. ..................... | 331/177 R |

OTHER PUBLICATIONS

Reynolds, David, "A 320 MHz CMOS Triple 8 bit DAC with On–Chip PLL and Hardware Cursor", *IEEE Journal of Solid–State Circuits,* vol. 29, No. 12, pp. 1545–1551.
Gray, Paul R., et al., *Analysis and Design of Analog Integrated Circuits,* John Wiley and Son, third edition, 1993, New York, pp. 270, 271 and 323–329.
Tsividis, Yannis, *Operation and Modeling of the MOS Transistor,* McGraw Hill, 1987, New York, p. 149, 149.

*Primary Examiner*—Arnold Kinkead
*Attorney, Agent, or Firm*—Koppel & Jacobs

[57] ABSTRACT

Signal-controlled oscillator structures are provided that are substantially insensitive to temperature, supply voltages and fabrication processes. They include a plurality of time-delay stages that are serially connected in a closed feedback ring and each of the stages includes an amplifier, at least one capacitor and at least one signal-controlled impedance element that couples the capacitor to the amplifier. Accordingly, the frequency of the oscillator is a function of a control signal applied to the impedance elements of the stages. In an oscillator embodiment, each of the amplifiers is a differential pair of transistors, the capacitor comprises first and second capacitors and the signal-controlled impedance element comprises first and second coupling transistors that each couples a respective one of the capacitors to a different side of the differential output. Preferably, first and second triode-biased load transistors are each coupled to a different side of the differential output and biased by a voltage reference which has a Vt-referenced source, a sensor and a summer. The source generates a source voltage and a feed-forward current, the sensor generates a feedback current that corrects the feed-forward current and the summer sums the feed-forward current and the feedback current into a sum current and generates a reference voltage that is responsive to the sum current. Accordingly, changes in the feed-forward current are corrected by changes in the feedback current so that the sum current and the reference voltage are substantially constant.

21 Claims, 5 Drawing Sheets

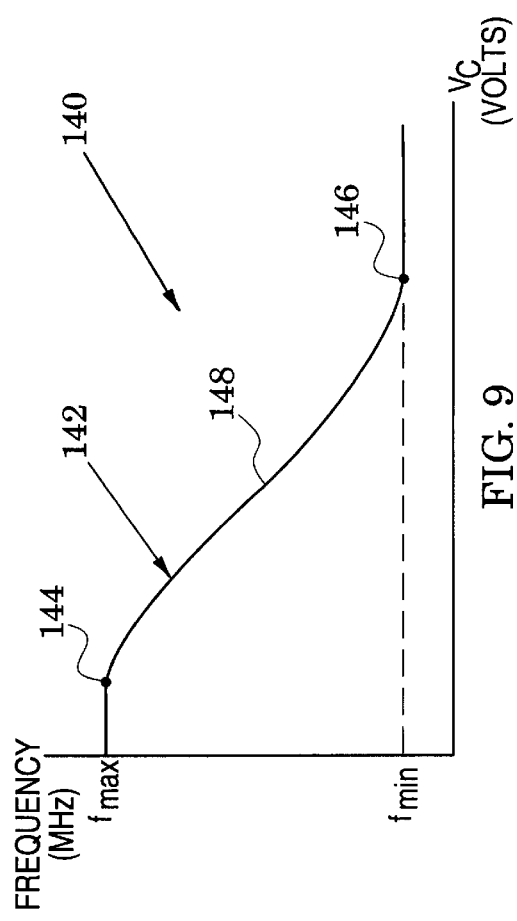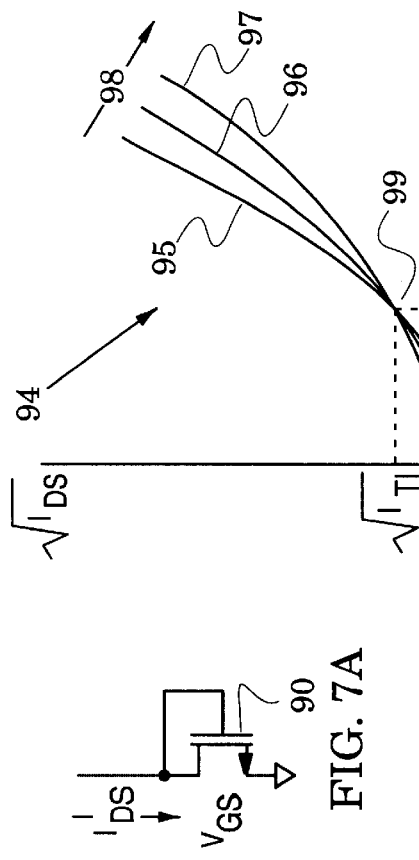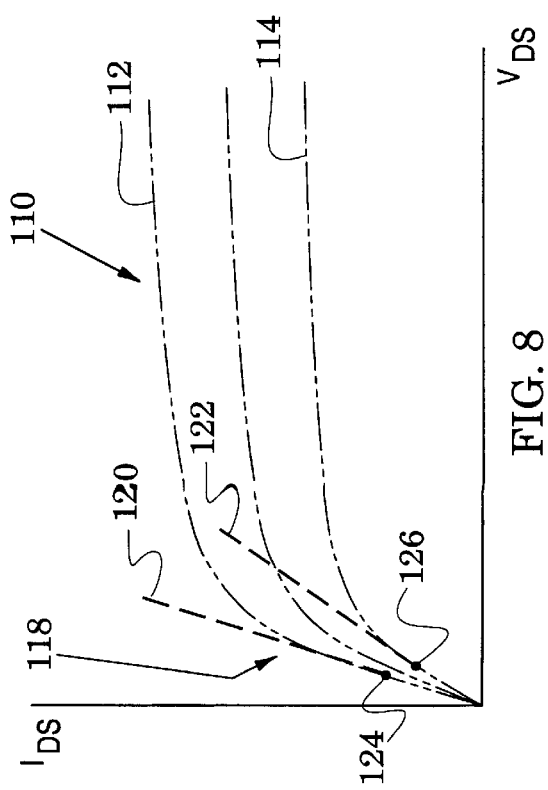

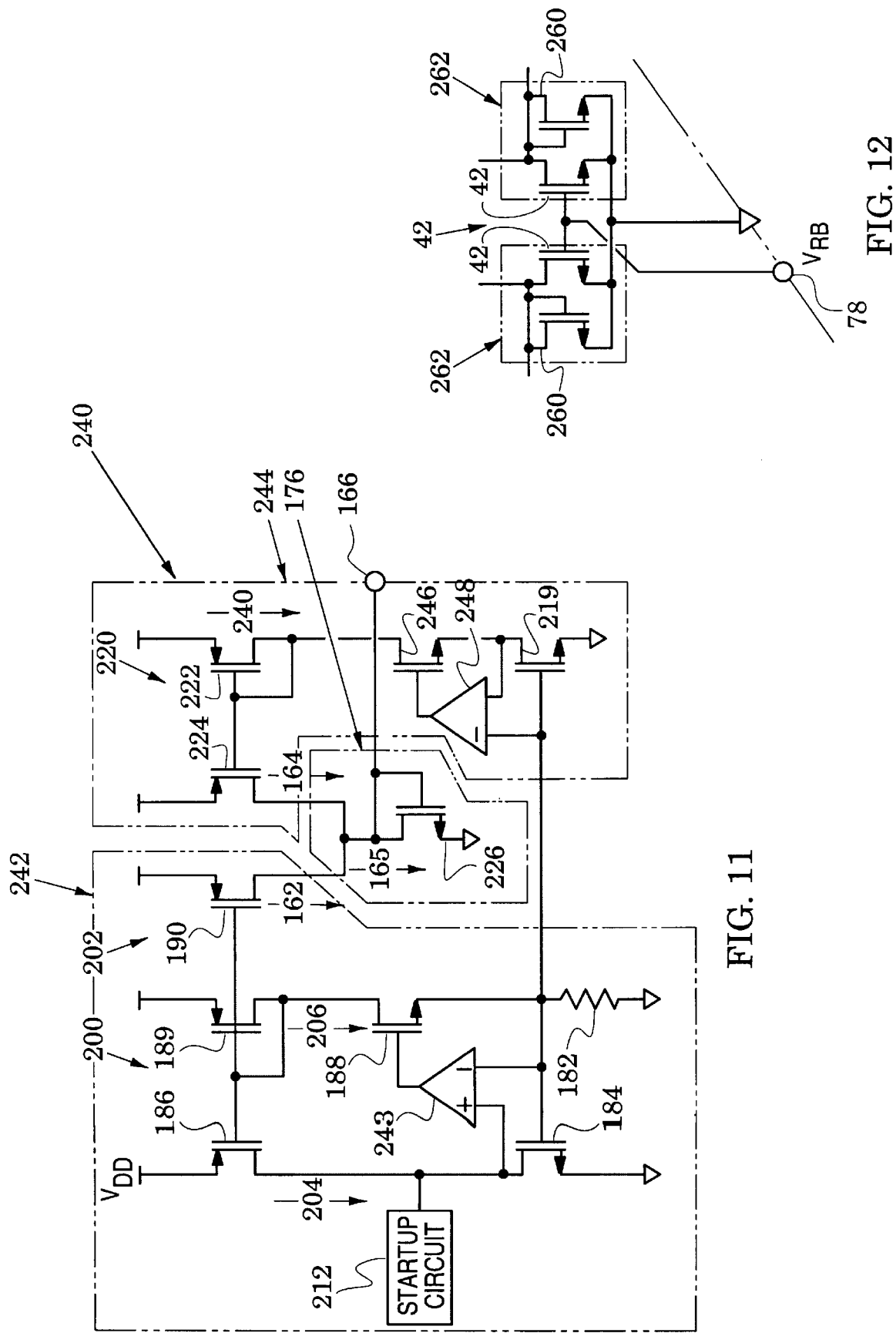

TEMPERATURE, SUPPLY AND PROCESS-INSENSITIVE SIGNAL-CONTROLLED OSCILLATORS

BACKGROUND OF THE INVENTION

1. Field of the Invention

The present invention relates generally to electronic oscillators and more particularly to signal-controlled ring oscillators.

2. Description of the Related Art

Stable signal-controlled oscillators find use in a variety of integrated circuit systems, e.g., phase locked loops, counters, frequency dividers and frequency multipliers. A popular integrated-circuit oscillator structure is a ring oscillator which couples a plurality of time-delay stages in a closed feedback ring. Because this configuration is simple, does not require large frequency-determining elements (e.g., inductors and capacitors) and is easily realized in a differential configuration, it is particularly suited for integrated circuit fabrication processes and systems.

FIG. 1 illustrates a conventional ring oscillator 20 (e.g., see FIG. 7 of Reynolds, David, "A 320 MHz CMOS Triple 8 bit DAC with On-Chip PLL and Hardware Cursor", *IEEE Journal of Solid-State Circuits*, Vol. 29, No. 12, pp. 1545–1551) which includes n differential time-delay stages 22 that are serially connected to form a closed feedback ring 23. In this configuration, n-1 stages are coupled to have input and output signals of the same polarity and one stage is coupled to have input and output signals of different polarities (i.e., this latter stage is coupled to provide signal inversion).

If the output signal of each stage 22 is delayed from its input signal by a time delay $\tau_D$, then the oscillator's signal at an output port 24 will have a frequency f given by $$f = \frac{1}{2n\tau_D}. \tag{1}$$

The time delay $\tau_D$ is typically a function of a control voltage $V_C$ which is carried through a control path 26 to each stage 22 as shown in FIG. 1. In addition, a bias circuit 27 provides a current bias voltage $V_{IB}$ which is carried through a bias path 28 to each stage.

Particular use of the control voltage $V_C$ and current bias voltage $V_{IB}$ is shown in the schematic diagram of FIG. 2 which details an exemplary time-delay stage 22. The stage has a differential amplifier in the form of a differential pair 30 of transistors 32 that are coupled between a differential input 34 and a differential output 36. The differential pair 30 joins a pair 40 of load transistors 42 and a current source in the form of a current-supply transistor 38. The load transistors are connected to ground and transistor 38 is connected to a power supply voltage $V_{DD}$.

In an exemplary realization, the time-delay stage is realized in a complementary metal-oxide semiconductor (CMOS) structure so that the transistors are metal-oxide field-effect transistors (MOSFETs). Transistors 32 and 38 are p-channel (PMOSFETs) and the load transistors 42 are n-channel (NMOSFETs). The gate of the current-supply transistor 38 is arranged to receive the current bias voltage $V_{IB}$ at a bias port 44 (this port is connected to the bias path 28 of FIG. 1). The gates of the differential pair 30 are coupled to the differential input 34 and their drains are coupled to the output 36. The gates of the load transistors 42 are connected to receive a control voltage $V_C$ at a control port 46 (that is connected to the control path 26 of FIG. 1) and these transistors are drain-coupled with the differential pair 30.

An output signal amplitude at the output port 36 is determined by the amount of current that is switched across the load transistors 42. Because this current is a function of the current bias voltage $V_{IB}$, adjustment of this voltage can realize a selected signal amplitude at the differential output 36. This signal amplitude is also the drain-to-source voltage $V_{DS}$ of the load transistors 42 which must be less than $V_{GS}-V_t$ in order to operate the load transistors in their triode region ($V_t$ being the MOSFET threshold voltage). Because $V_{GS}$ of the load transistors is the control voltage $V_C$, the current bias voltage $V_{IB}$ is set in the bais circuit 27 to insure that $V_{DS} \leq V_C-V_t$.

An understanding of the operation of the time-delay stage 22 is enhanced by consideration of the equivalent circuit 50 of FIG. 3 that models the stage. This equivalent circuit has a current source 52 in series with a parallel combination of a variable resistor 54V and a capacitor 56. The current source 52 represents the current $I_{DS_{38}}$ supplied by the current-supply transistor (38 in FIG. 2), the variable resistor 54V represents the variable resistance $R_V$ of either of the triode-biased load transistors (42 in FIG. 2) and the capacitor 56 represents the input capacitance $C_{input}$ of the following time-delay stage (in the ring arrangement of FIG. 1) plus any stray parasitic capacitance. This capacitance is the sum of the input capacitances (e.g., gate capacitance and drain junction capacitance) of the differential pair (30 in FIG. 2).

The equivalent circuit 50 shows that signals at the output port 36 of FIG. 2 change with a time constant RC so that the output voltage $V_o$ is given by $$V_o = I_{DS_{38}} R_V \left(1 - e^{\frac{1}{R_V C_{input}}}\right). \tag{2}$$

The output polarity of the time-delay stage 22 will change when the voltage of equation (2) reaches 50% of its final voltage of $I_{DS_{38}} R_V$ so that the time delay $\tau_D$ is approximately $0.693 R_V C_{input}$. Because the load transistors 42 are in their triode region, varying the control voltage $V_C$ changes the value of $R_V$ and, hence, the value of the time delay $\tau_D$. In accordance with equation (1), the frequency of the ring oscillator 20 of FIG. 1 is thus a function of the control voltage $V_C$ at the control port (46 in FIG. 2) of each time-delay stage.

Unfortunately, the resistance of MOSFETs in their triode region is temperature sensitive as shown by the relationship of $$R = \left(\mu C_{ox} \frac{W}{L}(V_{GS} - V_t)\right)^{-1} \tag{3}$$

in which $\mu$ is the channel carrier mobility, $C_{ox}$ is gate oxide capacitance per unit area, W/L is the channel width-to-length ratio, and $V_{GS}$ is gate-to-source voltage. Because mobility and threshold voltage are significantly affected by temperature, equation (3) indicates that the resistance $R_V$ is temperature sensitive and, accordingly, the time delay $\tau_D$ and the frequency f of the ring oscillator 20 of FIG. 1 are also temperature sensitive.

In addition to its temperature sensitivity, the ring oscillator 20 of FIG. 1 will also be sensitive to its supply voltage $V_{DD}$ and to variations in fabrication processes unless care is taken to decrease these sensitivities.

SUMMARY OF THE INVENTION

The present invention is directed to signal-controlled oscillator structures that are suited for realization in integrated circuit processes and that are substantially insensitive to temperature, supply voltages and fabrication processes.

These goals are realized with a plurality of time-delay stages that are serially connected in a closed feedback ring and each of the stages includes an amplifier, at least one capacitor and at least one signal-controlled impedance element that couples the capacitor to the amplifier. Accordingly, the frequency of the oscillator is a function of a control signal applied to the impedance elements of the stages.

In an exemplary CMOS oscillator embodiment of the invention, each of the signal-controlled impedance elements is at least one serially-connected metal-oxide field-effect transistor and the capacitor is a polysilicon capacitor.

In another oscillator embodiment, each of the amplifiers is a differential pair of transistors, the capacitor comprises first and second capacitors and the signal-controlled impedance element comprises first and second coupling transistors that each couples a respective one of the capacitors to a different side of the differential output.

In another oscillator embodiment, first and second triode-biased load transistors are each coupled to a different side of the differential output. These load transistors are preferably biased by a temperature-insensitive reference system such as those disclosed in associated and copending U.S. patent application Ser. No. 09/132,374 to George F. Diniz and Ronald B. Gray III, entitled "Temperature, Supply and Process-Insensitive CMOS Reference Structures", filed Aug. 8, 1998, and assigned to Analog Devices, Inc., the assignee of the present invention.

These systems include a Vt-referenced source that generates a source voltage and a feed-forward current, a sensor which generates a feedback current that corrects the feed-forward current and a summer that sums the feed-forward current and the feedback current into a sum current and generates a reference voltage that is responsive to the sum current. Accordingly, changes in the feed-forward current are corrected by changes in the feedback current so that the sum current and the reference voltage are substantially constant.

Because the resistance of the load transistors are therefore substantially constant, oscillators of the invention are significantly less temperature sensitive than the prior art. They are also supply insensitive because supply variations have little effect upon the time constants of the time-delay stages. When realized in CMOS structures and combined with references similar to the above-mentioned reference, they are substantially process insensitive because process-induced parameter variations (in mobility $\mu$ and threshold voltage $V_t$) in the reference voltage counter process-induced resistance changes in the load transistors.

In another exemplary oscillator embodiment, each of the load transistors is augmented with a diode-coupled transistor to thereby form a load structure whose effective resistance across frequency is more constant. As a result, the signal-controlled oscillator's output signal is limited to a lower and better defined level which is substantially constant across frequency.

The novel features of the invention are set forth with particularity in the appended claims. The invention will be best understood from the following description when read in conjunction with the accompanying drawings.

BRIEF DESCRIPTION OF THE DRAWINGS

FIGS. 7A and 7B respectively illustrate an exemplary diode-connected MOSFET and a graph of the MOSFET's current and voltage as a function of temperature;

FIG. 8 is a graph that illustrates voltage and current in a load transistor of the time-delay stage of FIG. 5;

FIG. 9 is a graph of the transfer characteristic $f/V_C$ of the oscillator of FIG. 4;

FIGS. 10 and 11 are schematic diagrams of voltage references that enhance the temperature, supply and process insensitivity of the oscillator of FIG. 4; and FIG. 12 illustrates another load transistor arrangement in the time-delay stage of FIG. 5.

DETAILED DESCRIPTION OF THE PREFERRED EMBODIMENTS

Figure 2:
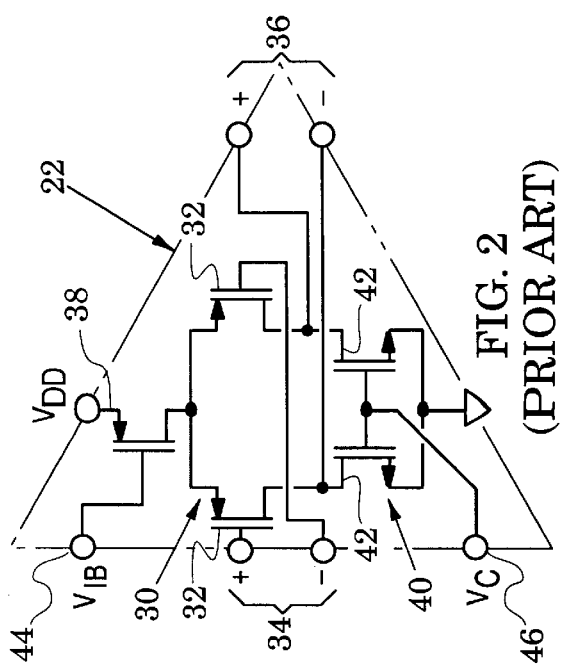
FIG. 2 is a schematic diagram of a time-delay stage within the curved line 2 of FIG. 1.
Figure 1:
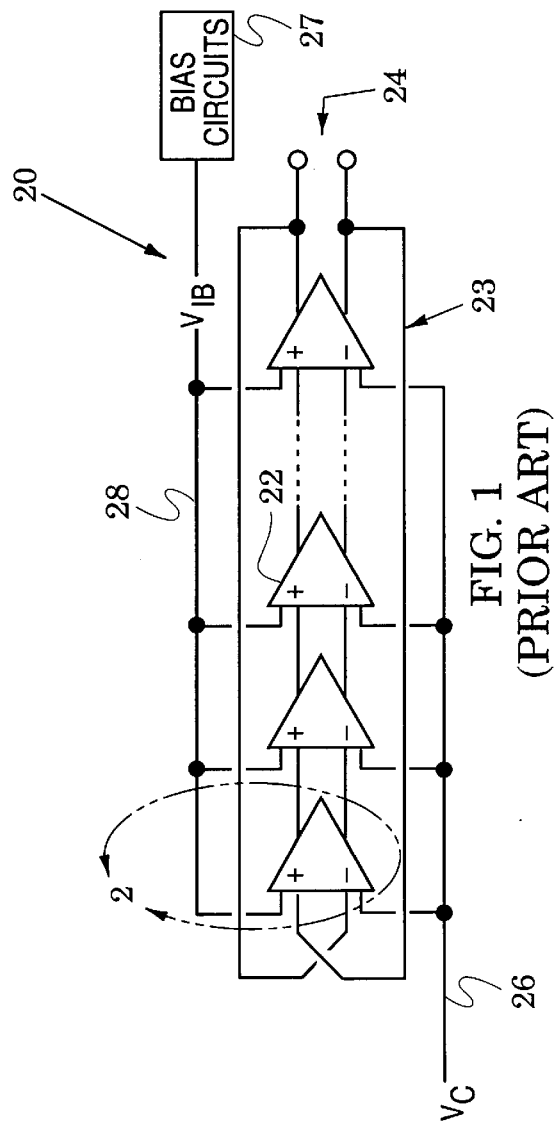
FIG. 1 is a block diagram of a conventional signal-controlled oscillator.
Figure 4:
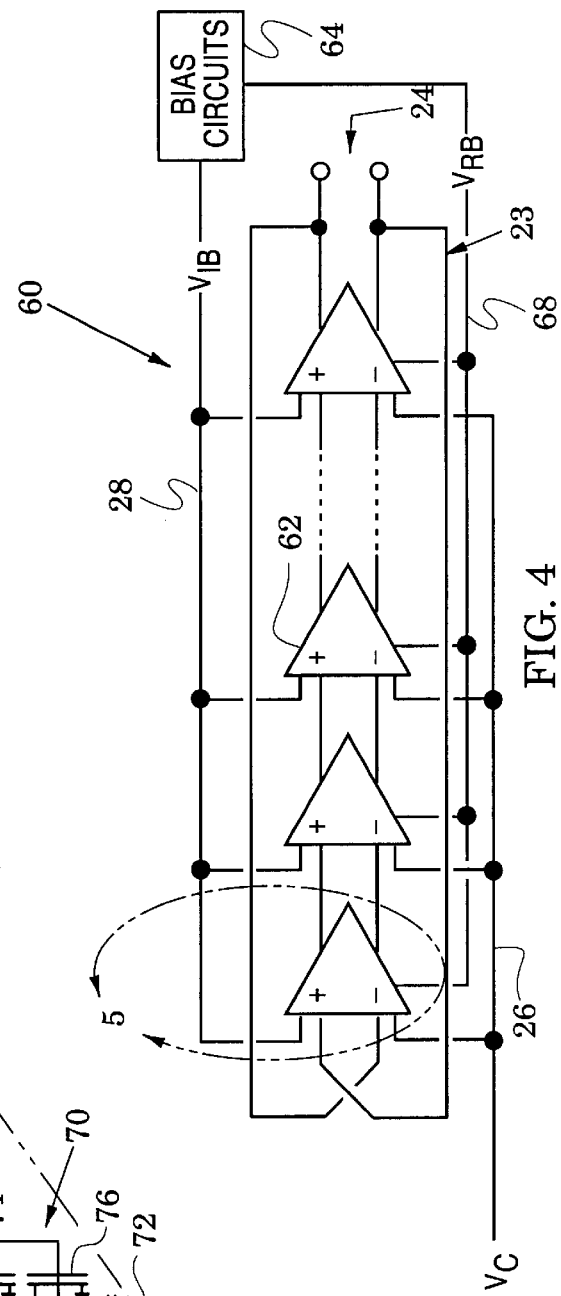
FIG. 4 is a block diagram of a signal-controlled oscillator of the present invention.

FIG. 4 illustrates a signal-controlled oscillator 60 whose temperature sensitivity is greatly reduced from that of the prior art (as exemplified by FIGS. 1 and 2). As in the oscillator 20 of FIG. 1, the oscillator 60 is arranged in a closed feedback ring 23 but the time-delay stages 22 of the oscillator 20 are replaced by time-delay stages 62. In addition, a bias circuit 64 generates the current bias voltage $V_{IB}$ and an additional resistance bias voltage $V_{RB}$. The resistance bias voltage $V_{RB}$ is carried to the stages 62 over an added bias path 68.

Figure 5:
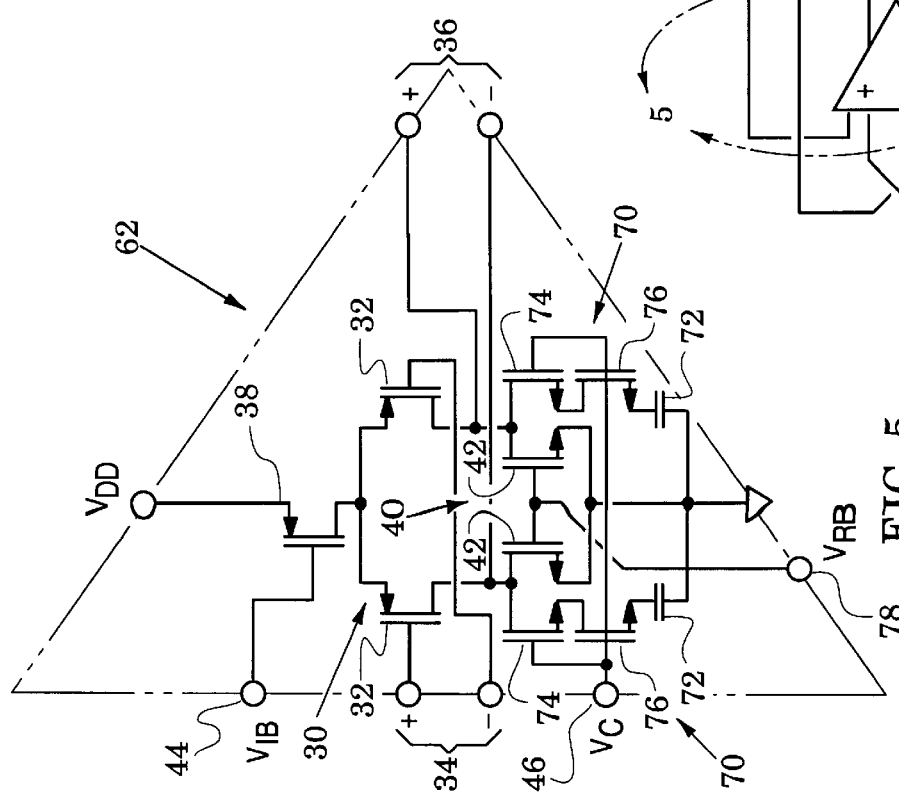
FIG. 5 is a schematic diagram of a time-delay stage within the curved line 5 of FIG. 4.

FIG. 5 details the structure of each time-delay stage 62. A portion of this structure is similar to that of the time-delay stage 22 of FIG. 2 with like elements indicated by like reference numbers. In contrast to the time-delay stage 22, however, a serially-connected timing circuit 70 is coupled to each side of the differential output 36. The timing circuit 70 includes a capacitor 72 and a pair of signal-controlled impedance elements. Also in contrast to the time-delay stage 22 of FIG. 2, the gates of the load transistors 42 are coupled to receive the resistance bias voltage $V_{RB}$ at a resistance bias port 78 (that is connected to the bias path 68 of FIG. 4).

The capacitor 72 is preferably realized as an integrated-circuit capacitor whose capacitance C has a temperature sensitivity that is at least as low as that of the input capacitance $C_{input}$ of the following time-delay stage. Exemplary integrated-circuit capacitors that meet this parameter and that are especially suited for CMOS fabrication processes include polysilicon capacitors and n-well capacitors. In the oscillator embodiment of FIG. 5, the signal-controlled impedance elements are realized as NMOSFETS 74 and 76 whose gates are coupled to the control voltage port 46.

Figure 3:
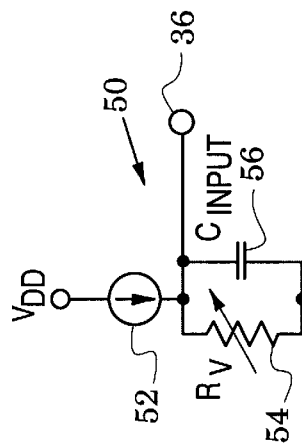
FIG. 3 illustrates an equivalent circuit that facilitates a time-delay study of the stage of FIG. 2.
Figure 6:
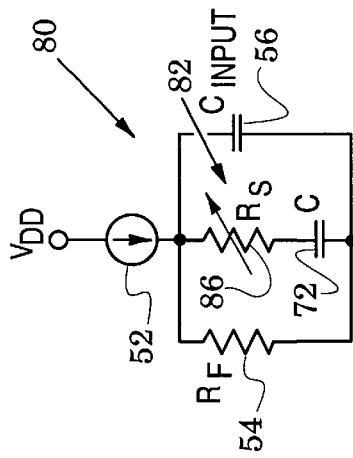
FIG. 6 illustrates an equivalent circuit that facilitates a time-delay study of the stage of FIG. 5.

The time delay of the stage 62 can be examined with the help of the equivalent circuit 80 of FIG. 6. This circuit includes the current source 52 and the input capacitor 56 of FIG. 3. In contrast, however, the variable resistor 54V of FIG. 3 is now a fixed resistor 54F (because of the fixed bias voltage $V_{RB}$) and a serially-connected circuit 82 has been added in parallel. This latter circuit is formed by one of the capacitors 72 of FIG. 5 and a variable resistor 86 that represents the series resistance $R_S$ of transistors 74 and 76 (i.e., the circuit 82 represents the timing circuit 70 of FIG. 5).

An operational description of the equivalent circuit 80 will be facilitated by preceding it with the following examination of temperature dependance in MOS transistors. FIG. 7A illustrates an exemplary diode-connected NMOSFET 90 that has a drain-to-source current $I_{DS}$ and a drain-to-source voltage $V_{DS}$ that equals its gate-to-source voltage $V_{GS}$. In this configuration, the transistor 90 is always operating in its saturation region. Assuming that narrow and short channel effects are avoided by fabricating the transistor 90 with channel width and length that are substantially greater than fabrication minimums, the relationship between $I_{DS}$ and $V_{GS}$ is given by $$I_{DS} = \frac{1}{2}\mu C_{ox}\frac{W}{L}(V_{GS} - V_t)^2. \quad (4)$$

The square root of equation (4) is shown for three exemplary temperatures as plots 95, 96 and 97 in the graph 94 of FIG. 7B and increasing temperature is indicated by a temperature arrow 98.

The plots 95, 96 and 97 define a crossover point 99 at which $I_{DS}$ and $V_{GS}$ are substantially temperature insensitive. The current and voltage that correspond to the temperature insensitive crossover point 99 are accordingly labeled $I_{TI}$ and $V_{TI}$. Equation (4) shows that device current $I_{DS}$ increases in response to increased mobility $\mu$ but decreases in response to increased threshold voltage $V_t$. It has been shown (e.g., see Tsividis, Yannis P., *Operation and Modeling of the MOS Transistor*, McGraw-Hill, Inc., 1987, New York, p. 148–149) that carrier mobility $\mu$ and threshold voltage $V_t$ can be respectively approximated as $$\mu(T) = \mu(T_r)\left(\frac{T}{T_r}\right)^{-k_3} \quad (5)$$

and $$V_t(T)=V_t(T_r)-k_4(T-T_r) \quad (6)$$

in which T is absolute temperature in degrees Kelvin, $T_r$ is room absolute temperature (300° K), $\mu(T_r)$ is a constant, $k_3$ is approximately 1.5 and $k_4$ is approximately 2.3 mV/°K.

As temperature increases, mobility $\mu$ and threshold voltage $V_t$ decrease in accordance with equations (5) and (6). At low device currents, the threshold voltage temperature dependence dominates and $I_{DS}$ increases with increased temperature as seen in the left side of FIG. 7B. At high device currents, in contrast, mobility temperature dependence dominates and $I_{DS}$ decreases with increased temperature as seen in the right side of FIG. 7B. The temperature insensitive current $I_{TI}$ defines the boundary between these opposite effects.

For each channel width-to-length ratio W/L, therefore, a corresponding gate-to-source voltage $V_{TI}$ can be found that produces a temperature-insensitive device current $I_{TI}$. Because of parameter differences (e.g., different carrier mobilities $\mu$), the W/L ratios corresponding to a given temperature-insensitive current $I_{TI}$ will generally be different for p and n channel MOSFETs.

FIG. 8 is a graph 110 that illustrates drain currents of the load transistors (42 of FIG. 5) as a function of their drain-to-source voltage $V_{DS}$. Each drain current curve, e.g., the curves 112 and 114, corresponds to a different gate-to-source voltage $V_{GS}$. With a sufficiently decreased drain-to-source bias, the transistors will operate in their triode region that is generally indicated by the arrow 118. Two exemplary lines 120 and 122 are drawn to be respectively tangent to drain curves 112 and 114 at respective tangent points 124 and 126 in the triode region. The different slopes of the tangent lines 120 and 122 are indicative of the different resistances that the load transistors will exhibit when biased at different tangent points.

In FIG. 5, the current bias voltage $V_{IB}$ (at bias port 44) and the resistance bias voltage $V_{RB}$ (at bias port 78) are set to insure that the load transistors operate in their triode region (i.e., $V_{DS}<V_{RB}-V_t$). In accordance with a feature of the present invention, the channel width-to-length ratio W/L of the load transistors 42 and the resistance bias voltage $V_{RB}$ are also chosen so that transistor operation is in the region of the crossover point (99 in FIG. 7B) and the resistance of the load transistors 42 is substantially temperature insensitive.

Returning attention to the equivalent circuit 80 of FIG. 6, it is apparent that the resistor 54F now has a constant resistance which is denoted $R_F$. The other elements of the circuit 80 are denoted as $R_S$, C and $C_{input}$ to facilitate the following operational description. When the control voltage $V_C$ (at control port 46 of FIG. 5) drops to a low value (e.g., ~0 volts), $R_S$ (which represents the series transistors 74 and 76 of FIG. 5) will be very large because the transistors are in their cutoff region. Thus, the time constant of circuit 80 is substantially $R_F C_{input}$ and the time delay $\tau_D$ of stage 62 of FIG. 5 is substantially $0.693 R_F C_{input}$. Still lower control voltages will have little effect on the time delay.

In contrast, a high control voltage $V_C$ (e.g., $\sim V_{DD}$ volts) causes the resistance $R_S$ to be very small because the transistors are in the lower portion of their triode region. The time constant of circuit 80 is therefore substantially $R_F(C+C_{input})$ and the time delay $\tau_D$ is substantially $0.693 R_F(C+C_{input})$. Still higher control voltages will have little effect on the time delay.

The graph 140 of FIG. 9 shows a plot 142 of frequency f=1(2π$\tau_D$) for the signal-controlled oscillator 60 of FIG. 4. In this plot, a first end point 144 indicates a high frequency corresponding to the time delay $\tau_D$ of $0.693 R_F C_{input}$ and a second end point 146 indicates a low frequency corresponding to the time delay $\tau_D$ of $0.693 R_F(C+C_{input})$. Because $R_F$, C and $C_{input}$ are all relatively temperature insensitive, these end points are substantially temperature insensitive.

In the plot region 148 between the end points 144 and 146, the frequency is also partially a function of $R_S$ which has higher temperature sensitivity than the other elements of the equivalent circuit 80 of FIG. 6. It has been found, however, that the frequency region 148 is also considerably less temperature sensitive than the frequency of the conventional ring oscillator 20 of FIG. 1. It is theorized that this is partially a result of the fact that the sensitivity of $R_S$ is dampened by the insensitivities of R, C and $C_{input}$ in this region and partially because the end points 144 and 146 are substantially fixed.

Figure 10:
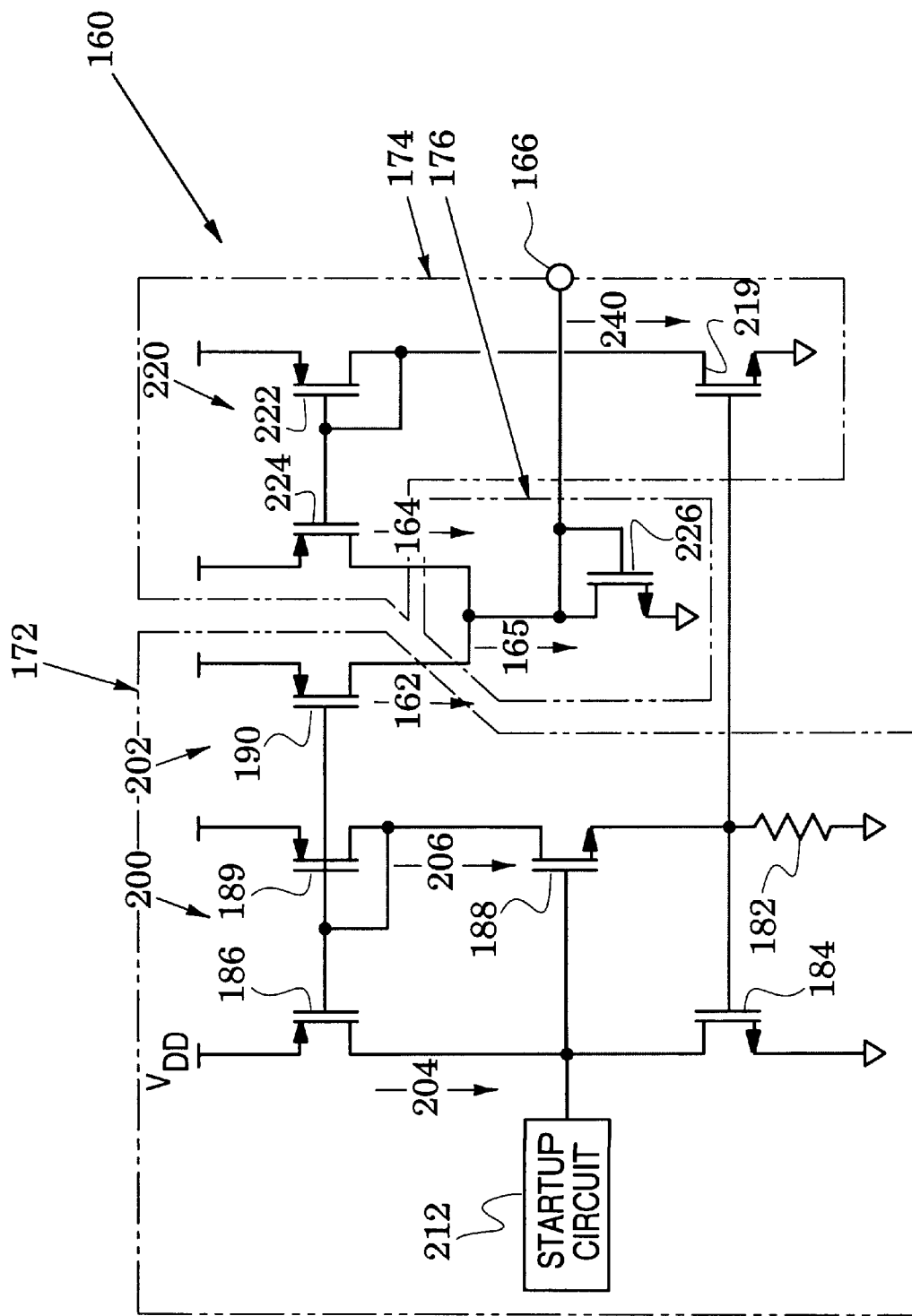

In order to fully realize the temperature, supply and process insensitivity of the signal-controlled oscillator 60 of FIG. 4, the resistance bias voltage $V_{RB}$ is preferably supplied by a reference that demonstrates similar insensitivities. For example, FIG. 10 illustrates a CMOS reference system 160 that offsets changes in a feed-forward current 162 with changes in a feedback current 164 so as to generate a sum current 165 and a reference voltage at an output port 166 that are substantially insensitive to temperature, power-supply and fabrication-process variations.

The reference voltage at the output port 166 can be coupled to the bias port 78 in FIG. 5 to supply the resistance bias voltage $V_{RB}$. As will be shown below, load transistors 42 of FIG. 5 will then operate at the temperature-insensitive crossover point 99 of FIG. 7B if their channel width-to-length ratio W/L is appropriately chosen.

In particular, the reference system 160 includes a $V_t$-referenced source 172, a sensor 174 and a summer 176. The source is referred to as a $V_t$-referenced source because its voltage standard is the MOSFET threshold voltage $V_t$.

In the source 172, a resistor 182 is coupled between the gate and source of an NMOSFET 184. The transistor 184 is coupled to $V_{DD}$ through a PMOSFET 186 and the resistor 182 is coupled to a $V_{DD}$ through an NMOSFET 188 and a diode-connected PMOSFET 189. The gate of transistor 188 is connected to the drains of transistors 184 and 186 and transistors 186 and 189 are gate-coupled. An output PMOSFET 190 is gate-coupled to transistors 186 and 189.

In operation of the reference source 172, transistors 186 and 189 form a first current mirror 200 and transistors 189 and 190 form a second current mirror 202. Because of the current mirror 200, a reference current 204 and a current 206 through transistors 188 and 189 will be substantially equal (assuming the transistors have the same channel dimensions). In addition, the reference current 206 through resistor 182 sets the $V_{GS}$ voltage of transistor 184. Combining this relationship with a well-known expression for $V_{GS}$ (e.g., see Gray, Paul R., et al., *Analysis and Design of Analog Integrated Circuits*, John Wiley and Son, third edition, 1993, New York, p. 64) yields $$IR_{182} = V_{GS} = V_t + \sqrt{\frac{2I}{\mu C_{ox} \frac{W}{L}}} \quad (7)$$

in which I represents the currents 204 and 206, $R_{182}$ is the resistance of resistor 182, $\mu$ is the channel carrier mobility of transistor 184, $C_{OX}$ is gate oxide capacitance per unit area of transistor 184 and W/L is the channel width-to-length ratio of transistor 184.

If the ratio W/L is large, the root term in equation (7) can be neglected which leaves $V_{GS}$ equal to $V_t$. Because the voltage across the resistor 182 is then substantially $V_t$, the current 206 is approximately $V_t/R_{182}$ and the current mirror 200 forces the reference current 204 to also approximate $V_t/R_{182}$.

The source 172 is arranged to be a self-biasing structure and such structures typically exhibit an undesired zero-current operating point in addition to the intended operating point. The current mirror 200 forces the currents 204 and 206 to be equal while the connection of resistor 182 to the gate of transistor 184 forces the gate-to-source voltage $V_{GS}$ of transistor 184 to equal the current-induced voltage across the resistor.

There are two places where both of these currents and voltages are equal. One is the intended operating point described above and the other is at a zero-current state. If some current initially flows in the source 172, it will drive itself to the intended operating point. To insure that the source is driven to this stable operating point, therefore, a startup circuit 212 is arranged to inject a starting current into the structure of the reference system 160.

In the reference of FIG. 10, the sensor 174 is formed with a sense NMOSFET 219 and a current mirror 220 that includes a diode-coupled PMOSFET 222 and a PMOSFET 224. Transistors 222 and 224 are gate-coupled and transistors 219 and 222 are drain-coupled.

The summer 176 is a diode-coupled NMOSFET 226 whose drain receives and sums the feed-forward current 162 and the feedback current 164 to form the sum current 165. In response to the sum current 165 in its drain, the transistor 226 generates the reference voltage at the output port 166.

Equation (7) indicates that resistor 182 and the channel width-to-length ratio W/L of transistor 184 can be selected so that the gate-to-source voltage $V_{GS}$ and the current 204 of this transistor define a temperature insensitive crossover point similar to point 99 of FIG. 7B. Because transistors 184 and 219 have the same gate-to-source voltage $V_{GS}$, a sense current 240 through the transistor 219 can also be made insensitive to temperature by configuring transistor 219 with the same channel width-to-length ratio W/L of transistor 184.

Transistors 184 and 219 will now operate at the same operating point so that the currents 204, 206 and 240 are substantially equal. Accordingly, a channel width-to-length ratio W/L can be selected for transistors 186, 189 and 222 that causes them to operate at a temperature insensitive crossover point. Because they are P-type devices, their channel width-to-length ratio W/L will generally not be the same as that of the N-type devices 184 and 219.

In accordance with the teachings of the invention, transistors 190 and 224 are respectively configured with first and second channel width-to-length ratios W/L that are first and second portions of the channel width-to-length ratio W/L of transistors 186, 189 and 222 wherein the first and second portions add substantially to one. The portions, however, need not be equal. As a first example, the first and second portions could be 40% and 60%. As a second example, the first and second portions could be 50% and 50%. Accordingly, the feed-forward current 162 and the feedback current 164 will also be the same first and second portions of the currents 204, 206 and 240 and the sum current 165 will then be substantially equal to these latter currents.

If the channel width-to-length ratio W/L of the summer transistor 226 is then set equal to that of transistors 184 and 219, the transistor 226 also operates at a temperature insensitive crossover point. Finally, a channel width-to-length ratio W/L (typically ½ that of the ratio of transistors 186, 189 and 222) can be selected for transistors 190 and 224 that causes them to also operate at a temperature insensitive crossover point.

The temperature insensitivity of the invention will still be enhanced if the summer transistor 226 operates in the region of the temperature insensitive crossover point (99 of FIG. 7B) rather than precisely at that point, i.e., the first and second portions need not add precisely to one. When practicing the invention, therefore, the first and second portions need not be equal but they preferably add to a number n wherein 0.1<n<10 and, more preferably, wherein 0.5<n<1.5.

With the channel width-to-length ratio W/L selections described above, the transistors of the reference system 160 of FIG. 10 operate at temperature insensitive crossover points. In addition, the structure of the reference system also corrects for changes induced by temperature sensitivity of the resistor 182.

Typical resistors that are formed in CMOS fabrication processes include thin-film resistors (e.g., nichrome, tantalum and cermet), polysilicon resistors and diffused resistors. All of these resistor structures exhibit temperature sensitivity and, in particular, they generally exhibit positive temperature coefficients. The resistance of resistor 182 will, accordingly, have some sensitivity to temperature and the currents 204 and 206 of the reference 172 will be shifted away from their temperature insensitive points.

In operation of the reference 172, the current mirror 200 urges currents 204 and 206 to be equal while the feedback circuit of transistors 184 and 188 and the resistor 182 requires the current 206 to be a function of the reference current 204. These circuits settle at an operating current that satisfies both conditions. After temperature changes cause a resistance increase in the resistor 182, the current mirror 200 will still urge equality of currents 204 and 206 but there will be a general decrease in the functional expression for the current 206.

The reference source 172, therefore, settles at a new operating point in which the voltage across resistor 182 has increased and the currents 204, 206 and 162 have decreased. In response to the voltage increase, the sense transistor 219 causes an increase in the feedback current 164 that opposes the decrease in the feed-forward current 162. Accordingly, the sum current 165 through the output transistor 226 remains essentially at its temperature insensitive crossover point.

In summary, therefore, the $V_t$-referenced source 172 generates a source voltage and a feed-forward current 162 that has a first response to changes in the source voltage, the sensor 174 generates a feedback current 164 that has a second response to the changes that substantially offsets the first response. The summer 165 sums the feed-forward current and the feedback current into a sum current 165 and generates a reference voltage 166 that is responsive to the sum current. Because of the error correction of the feedback current 164, the sum current 165 and the reference voltage 166 remain substantially constant.

In the reference system 160 of FIG. 10, transistors 184 and 219 are respectively involved in the generation of the feed-forward current 162 and the feedback current 164. They operate with the same gate-to-source voltage but their drain-to-source voltages $V_{DS}$ will change in response to circuit variations (e.g., temperature-induced variations). The insensitivity of the system would be further enhanced if these variations were reduced. Accordingly, the reference system 240 of FIG. 11 acts to stabilize these drain-to-source voltages.

The system 240 is similar to the system 160 of FIG. 10 with like elements indicated by like reference numbers. In contrast to the system 160, however, the source 172 has been modified to a source 242 that has a differential amplifier 243. The input of this amplifier is coupled across the drain and gate of transistor 184 and its output supplies the drive of the gate of transistor 188. Because the output voltage is in the region of a few volts and the amplifier has a high differential gain, the voltage between the drain-to-gate voltage of transistor 184 is essentially reduced to zero. Thus, transistor 184 is placed in a "virtual" diode-connected mode and its drain-to-gate voltage is stabilized over all operating conditions.

In a similar manner, the sensor 174 has been modified to a sensor 244 that stabilizes the drain-to-gate voltage of sense transistor 219. This is realized by positioning a coupling transistor 246 between the transistor 219 and the current mirror 220. The input of a differential amplifier 248 is coupled across the drain and gate of transistor 219 and the amplifier's output is connected to the gate of the coupling transistor 246.

Each of the load transistors 42 of FIG. 5 were modeled in FIG. 6 as a temperature-insensitive fixed resistor $R_F$. In operation of the signal-controlled oscillator 60 of FIG. 4, the operating point of these load transistors moves between their triode and saturation regions so that they might more accurately be described as having a temperature-insensitive $I_{DS}$ versus $V_{DS}$ transfer function, i.e., they exhibit a substantially fixed resistance in their triode region and a substantially fixed current in their saturation region.

The signal-controlled oscillator 60 of FIG. 4 generates an output signal at its output port 24 whose frequency is a function of the control voltage $V_C$. This output signal is also the signal at output port 36 in FIG. 5 where it is developed across a differential pair 40 of load transistors 42. It has been found that the stability of the oscillator's output voltage level signal as a function of its frequency is enhanced by augmenting each load transistor 42 with a diode-coupled transistor 260 to thereby form a load structure 262 as shown in FIG. 12 (which illustrates only the relevant portions of FIG. 5).

As a signal across one of the load transistors 42 of FIG. 5 approaches the transistor's saturation voltage, the current through the transistor begins to limit and its effective resistance increases. In contrast, the diode-coupled transistors 260 of FIG. 12 always operate in their triode region so that an increased output signal generates a greater current through the load structures 262. Accordingly, the output signal is limited to a lower and better defined level which is substantially constant across frequency.

The signal-controlled oscillators described above teach structures that are significantly less temperature sensitive than the prior art. These structures include voltage references which further reduce temperature sensitivity with a feedback current that corrects temperature-induced errors in a feed-forward current and with selection of channel width-to-length ratios W/L and gate-to-source voltages $V_{GS}$ that operate transistors at temperature insensitive crossover points.

These oscillator structures are also supply insensitive. For example, variations in the supply $V_{DD}$ of the time-delay stage 62 of FIG. 5 may change voltages across transistors 38 and 32 but will not change the output amplitude at port 36 and have little effect upon the time constants of the equivalent circuit 80 of FIG. 6. Hence, they have little effect on the frequency of the oscillator 60 of FIG. 4.

In addition, the teachings of the invention yield oscillators that are substantially process insensitive. The reference system 160 of FIG. 10 and the signal-controlled oscillator of FIGS. 4 and 5 are both realized in CMOS structures. CMOS process variations primarily change the parameters of mobility $\mu$ and threshold voltage $V_t$ which affect transistor speeds. This may cause changes in the resistance of triode-biased transistors which, in turn, changes the frequency of the invention's oscillators (e.g., the oscillator 60 of FIG. 5).

However, these same parameter changes will effect changes in the reference output voltage (e.g., that at the output port 166 of FIG. 10) that counter the resistance changes. This process compensation is not generally found in other oscillator and reference structures. For example, "bandgap" references typically combine CMOS and bipolar structures and process-induced variations in bipolar parameters (e.g., $V_{BE}$) are typically unrelated to those of CMOS structures.

Although they have been illustrated with reference to exemplary types of MOSFETs and exemplary polarities of power supplies, the teachings of the invention can obviously be practiced with different reference systems that substitute differ rent types and polarities.

Oscillator stages of the invention (e.g., stage 62 of FIG. 5) are primarily designed to generate time delay. Accordingly, oscillator embodiments of the invention may be structured with various amplifier gains (e.g., negative or positive) that are consistent with sustained oscillation (i.e., gain $\geq 1$ at the oscillation frequency). Although the invention has been illustrated with differential stage embodiments that have excellent noise immunities, these teachings may equivalently be practiced with single-ended stage embodiments.

The exemplary timing circuit 70 of FIG. 5 uses a pair of serially-connected transistors 74 and 76 for increased tuning sensitivity but other oscillator embodiments can be formed with one or a plurality of signal-controlled impedances.

The preferred embodiments of the invention described herein are exemplary and numerous modifications, dimensional variations and rearrangements can be readily envisioned to achieve substantially equivalent results, all of which are intended to be embraced within the scope of the appended claims.

We claim:

1. A signal-controlled oscillator system, comprising:

a plurality of time-delay stages that are serially connected in a closed feedback ring, wherein each of said stages includes:

a) an amplifier that includes a differential pair of transistors having a differential input and a differential output;

b) first and second capacitors;

c) signal-controlled impedance elements comprising first and second coupling transistors that each couples a respective one of said capacitors to a different side of said differential output; and d) first and second fixed-bias load transistors that are each coupled to a different side of said differential output;

the frequency of said oscillator thereby being a function of a control signal applied to the impedance elements of said stages; and a voltage reference connected to bias said first and second load transistors, said voltage reference including:

e) a $V_t$ referenced source that generates a source voltage and a feed-forward current that has a first response to chances in said source voltage;

f) a sensor which generates a feedback current that has a second response to said changes that substantially offsets said first response; and g) a summer that sums said feed-forward current and said feedback current into a sum current and generates a reference voltage that is responsive to said sum current;

changes in said feed-forward current thus being corrected by changes in said feedback current so that said sum current and said reference voltage are substantially constant.

2. The oscillator of claim 1, wherein said differential pair transistors, said coupling transistors and said load transistors are metal-oxide field-effect transistors and said control signal is applied to the gates of said coupling transistors.

3. A signal controlled oscillator, comprising:

a plurality of time-delay stages that are serially connected in a closed feedback ring, wherein each of said stages includes:

a) an amplifier that includes a differential pair of transistors having a differential input and a differential output;

b) first and second capacitors;

c) signal-controlled impedance elements that comprise first and second coupling transistors that each couples a respective one of said capacitors to a different side of said differential output;

d) first and second load transistors that are each coupled to a different side of said differential output;

e) a gate bias circuit connected to apply a substantially constant gate bias to said load transistors, said load transistors having channel width-to-length ratios which, together with the substantially constant gate bias applied to said load transistors by said gate bias circuit, causes each of said load transistors to have a resistance which is substantially temperature insensitive; and f) a control signal circuit connected to apply a variable control signal to said impedance elements, with the frequency of said oscillator thereby being a function of the control signal.

4. The oscillator of claim 3, wherein each of said stages includes a current source coupled to deliver current to said differential input.

5. The oscillator of claim 3, wherein said coupling transistors, said load transistors and the transistors of said differential pair are metal-oxide field-effect transistors, and said control signal is applied to the gates of said coupling transistors.

6. The oscillator of claim 3, wherein each of said capacitors is a polysilicon capacitor.

7. A signal-controlled oscillator system, comprising:

a plurality of time-delay stages that are serially connected in a closed feedback ring, wherein each of said stages includes;

a) a differential amplifier having a differential input and a differential output and including a differential pair of transistors;

b) first and second capacitors;

c) first and second signal-controlled impedance elements that respectively couple said first and second capacitors to opposite sides of said differential output, wherein said signal-controlled impedance elements are coupling transistors;

d) first and second load transistors that are each coupled to a different side of said differential output; and e) first and second diode-coupled transistors that are respectively arranged in parallel with said first and second load transistors;

the frequency of said oscillator thereby being a function of a control signal applied to the impedance elements of said stages; and a voltage reference connected to bias said first and second load transistors, said voltage reference including:

f) a $V_t$ referenced source that generates a source voltage and a feed-forward current that has a first response to changes in said source voltage;

g) a sensor which generates a feedback current that has a second response to said changes that substantially offsets said first response; and h) a summer that sums said feed-forward current and said feedback current into a sum current and generates a reference voltage that is responsive to said sum current;

changes in said feed-forward current thus being corrected by changes in said feedback current so that said sum current and said reference voltage are substantially constant.

8. The oscillator of claim 7, wherein said coupling transistors, said load transistors and the transistors of said differential pair are metal-oxide field-effect transistors and said control signal is applied to the gates of said coupling transistors.

9. The oscillator of claim 7, wherein each of said stages includes a current source coupled to deliver current to said differential input.

10. The oscillator of claim 7, wherein each of said capacitors is a polysilicon capacitor.

11. A signal-controlled oscillator system, comprising:

a plurality of time-delay stages that are serially connected in a closed feedback ring wherein each of said stages includes;

a) a differential pair of metal-oxide field-effect transistors having a differential input and a differential output;

b) first and second capacitors; and c) first and second metal-oxide field-effect coupling transistors that respectively couple said first and second capacitors to opposite sides of said differential output; and d) first and second metal-oxide field-effect load transistors that are coupled to opposite sides of said differential output;

the oscillation frequency of said ring thereby a function of a control signal applied to the gates of said coupling transistors; and a voltage reference connected to bias said first and second load transistors, said voltage reference including:

a) a $V_t$-referenced source that generates a source voltage and a feed-forward current that has a first response to changes in said source voltage;

b) a sensor which generates a feedback current that has a second response to said changes that substantially offsets said first response; and c) a summer that sums said feed-forward current and said feedback current into a sum current and generates a reference voltage that is responsive to said sum current;

changes in said feed-forward current thus corrected by changes in said feedback current so that said sum current and said reference voltage are substantially constant.

12. The system of claim 11, wherein said $V_t$-referenced source includes:

a first metal-oxide field-effect transistor;

a resistor coupled between the gate and source of said first transistor;

a second metal-oxide field-effect transistor having its gate and source respectively coupled to the drain and gate of said first transistor;

a current mirror coupled to the drains of said first and second transistors; and a third metal-oxide field-effect transistor coupled to mirror said current mirror and generate said feed-forward current with said source voltage being generated across said resistor.

13. The system of claim 11, wherein said sensor includes:

a sense transistor that generates a sense current in response to said source voltage; and a current mirror coupled to generate said feedback current by mirroring said sense current.

14. The system of claim 11, wherein said summer comprises a diode-coupled metal-oxide field-effect transistor.

15. The system of claim 11, further including first and second diode-coupled transistors that are respectively arranged in parallel with said first and second load transistors.

16. The system of claim 11, wherein each of said capacitors is a polysilicon capacitor.

17. The oscillator of claim 1, wherein said signal-controlled impedance elements further comprise third and fourth coupling transistors that are respectively arranged in series with said first and second coupling transistors.

18. The oscillator of claim 1, wherein each of said stages further includes first and second diode-coupled transistors that are respectively arranged in parallel with said first and second load transistors.

19. The oscillator of claim 1, wherein each of said capacitors is a polysilicon capacitor.

20. The oscillator of claim 1, wherein each of said stages includes a current source coupled to said differential input.

21. The oscillator of claim 3, further comprising first and second diode-coupled transistors that are respectively arranged in parallel with said first and second load transistors.

* * * * *